(12) United States Patent
Lauter et al.

(10) Patent No.: US 6,324,244 B1
(45) Date of Patent: Nov. 27, 2001

(54) COMPUTED TOMOGRAPHY APPARATUS

(75) Inventors: Josef Lauter, Geilenkirchen; Stefan Schneider; Herfried Karl Wieczorek, both of Aachen, all of (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/668,910

(22) Filed: Sep. 25, 2000

(30) Foreign Application Priority Data

Sep. 24, 1999 (DE) .............................................. 199 45 763

(51) Int. Cl.⁷ ....................................................... A61B 6/03
(52) U.S. Cl. .................. 378/4; 378/19; 378/901; 382/131
(58) Field of Search .................. 378/4, 19, 901; 382/131, 128

(56) References Cited

U.S. PATENT DOCUMENTS 5,220,589 * 6/1993 Gard .......................................... 378/4

FOREIGN PATENT DOCUMENTS 3634190   4/1988   (DE) ................................ H04N/1/40

* cited by examiner

*Primary Examiner*—Drew Dunn
(74) *Attorney, Agent, or Firm*—John F. Vodopia

(57) ABSTRACT

The invention relates to a computed tomography apparatus which includes a radiation source, a detector device and an analog-to-digital converter for converting the detector output signals into digital values. In order to realize a computed tomography apparatus in which the number of binary positions required for the encoding of the signal entering the analog-to-digital converter is reduced while using simple components which operate with a high degree of reliability, use is made of a read-out amplifier (1) which precedes the analog-to-digital converter (10), has a plurality of gain factors and a control system (12) for the relevant gain factor which, when a predetermined limit value of the integrated input signal is reached, automatically selects an appropriate, each time lower gain factor for the step-wise linear approximation of a proportional ratio between the digital values and the square root of the detector output signals.

8 Claims, 2 Drawing Sheets

| amplification factor in bit | value in bit | max. signal in bit |
|---|---|---|
| 0 | 5 | 8 |
| -1 | 6 | 10 |
| -2 | 7 | 12 |
| -3 | 8 | 14 |
| -4 | 9 | 16 |
| -5 | 10 | 18 |
| -6 | 11 | 20 |
|  | Σ 4064/12 bit |  |

FIG. 3

COMPUTED TOMOGRAPHY APPARATUS

BACKGROUND OF THE INVENTION

The invention relates to a computed tomography apparatus which includes a radiation source, a detector device and an analog-to-digital converter for converting the detector output signals into digital values.

SUMMARY OF THE INVENTION

Generally speaking, the photons received in the detector device, that is, light photons or X-ray photons, are processed in a data acquisition system. Therein, the analog signals from the photosensors are amplified and converted into digital signals for further processing.

OS 36 34 190 discloses an arrangement for digital radiography which includes an imaging device whose physical parameters can be varied by X-rays, a detector device which senses and converts such variations into an electric signal, and an analog-to-digital converter for converting the detector output signals into digital values. On the one hand such an analog-to-digital converter must have a comparatively high sampling frequency so as to enable the processing, within an acceptable period of time, of the large amounts of data that are liable to occur in digital radiography; on the other hand, the resolution of the analog-to-digital converter, that is, the number of binary positions with which the analog-to-digital converter outputs the digital sample value, must be large enough to enable the transfer of the complete information contents of an X-ray image. The detector output signals are digitized in a binary number whose absolute value is expressed as a number of positions. The time required for an analog-to-digital converter increases as a function of the number of binary positions required for each sample value. Therefore, for the further processing of such binary numbers it is desirable that the number of bits is small. To this end, OS 36 34 190 proposes that the digital values are always proportional to the square root of the detector output signal.

In order to establish such a non-linear relationship between the digital sampling value and the detector output signal, OS 36 34 190 proposes to provide the analog-to-digital converter with non-linear quantization stages. Alternatively, use can be made of an analog-to-digital converter having a linear characteristic by arrangement of a root extractor between the detector and the analog-to-digital converter. The known root extractor has a drawback in that it has a complex construction and hence is vulnerable.

On the basis of the described state of the art, it is an object of the invention to provide a computed tomography apparatus of the kind set forth in which the number of binary positions required for the encoding of the signal entering the analog-to-digital converter is reduced by means of components which overall have a simple construction and operate with a high degree of reliability.

In a computed tomography apparatus this object is achieved in that the analog-to-digital converter is preceded by a read-out amplifier having a plurality of gain factors, and in that there is provided a control system for the gain factor which, when a predetermined limit value of the integrated input signal is reached, automatically selects a suitable gain factor for the step-wise linear approximation of a proportional ratio between the digital values and the square root of the detector output signals.

The analog-to-digital converter is preceded by an amplifier which has a plurality of gain factors and in which linear quantization steps are performed. By appropriate selection of the gain factors a linear approximation of the root function is performed in that, after predetermined limit values of the integrated charge or values corresponding to the integrated charge have been reached, the root function is linearly approximated by switching over to a correspondingly lower gain factor. The amplification stages are adjusted by means of parallel-connected capacitors which are readily available components.

Overall this solution offers the advantage that input signals can be processed at a high speed, despite a wide dynamic range. Granted, analog-to-digital converters are known which are also capable of processing large numbers of bits, for example, 17 bits or more. However, as the number of bits is higher, an analog-to-digital converter becomes slower in proportion to $2^n$. When in conformity with the invention the individual local dynamic ranges of the read-out amplifier are reduced by way of the step-wise linear approximation of the root function, for example, to 12 without limiting the overall dynamic range of the amplifier, for example, amounting to 17 bits, the analog-to-digital converter need be designed overall for 12 bits only. The processing speed is then faster in comparison with a 17 bit analog-to-digital converter, but the ultimate information of the signal to be processed will not be restricted.

Moreover, it is an advantage that errors which are due to the inevitable dark currents of the photodiode and the offset of the amplifier can be corrected by way of mathematical processes according to the solution of the invention involving an amplifier; this is not possible in the prior art root extraction device with a corresponding root function.

The relevant gain factor is chosen so that the square root ratio between the detector output signals and the digital values is linearly approximated during the relevant interval. Overall, the limit value on the basis of which the control system switches over to a smaller gain factor is predetermined by the dynamic range that can be handled by the respective selected analog-to-digital converter. This means, for example, that in the case of a 12 bit analog-to-digital converter this limit value is reached for an integrated charge whose signal amounts to 12 bits. Moreover, the analog-to-digital converter is chosen in dependence on the noise of the smallest signal to be processed. The gain factor should preferably be determined by calculation in such a manner that the noise corresponding to the respective smallest signal in the relevant interval is still detected and that the number of bits of the respective largest signal does not exceed the number of bits that can be handled by the analog-to-digital converter.

In a first embodiment of the invention the amplifier input signals are summed as analog signals. When a predetermined maximum limit value of the analog output voltage is reached, the control system switches over to a respective lower gain factor. In a second embodiment of the invention digit-dependent switching takes place in that the integrated analog output voltage is expressed by a digit. In both embodiments the output voltage of the amplifier, or the digit value, is converted in the analog-to-digital converter so as to form a digital signal which is multiplied again by the selected gain factor during post-processing so as to enable further operation with the realistic signal.

In order to enhance the operating stability, the instant of switching over to a lower gain factor is limited, preferably by means of a restricted time window as disclosed in claim 6.

It is also proposed to reset the amplifier each time upon switching over to a different gain factor. Interference voltages which are unavoidable during switching over can thus be eliminated. The summed voltages are arithmetically processed.

When use is made of the CMOS technology, the read-out amplifier can be arranged in the direct vicinity of a photo-sensor (pixel) of the computed tomography apparatus delivering the input signal.

BRIEF DESCRIPTION OF THE DRAWINGS

The invention will be described in detail hereinafter with reference to the Figures. Therein:

FIG. 3 shows a table with the digit counting method for switching over the gain factors.

DESCRIPTION OF THE PREFERRED EMBODIMENTS

Figure 1:
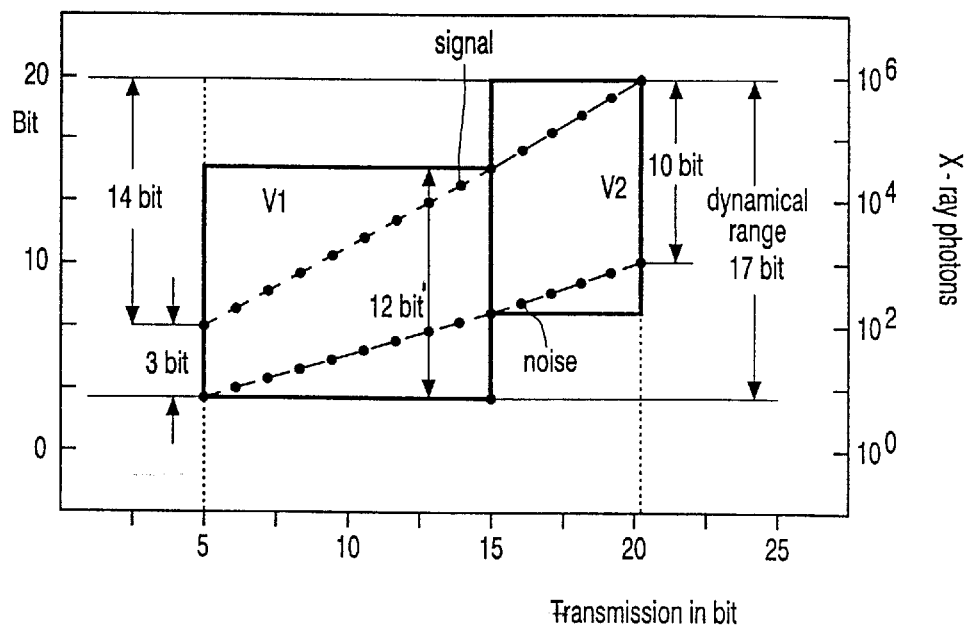
FIG. 1 shows the logarithmized number of X-ray photons and the noise in bits as a function of the transferred photons.

FIG. 1 shows the dynamic range of a quantum-limited detector system in which the resolution is not limited by the electric noise, but by the statistical deviations of the input signals. FIG. 1 illustrates that the number of X-ray photons fluctuates by a factor 16,000, starting from the lowest signal (approximately 64 photons) to the highest signal (approximately one million photons). This corresponds to approximately 14 bits for the number of binary numbers required.

The signal-to-noise will be explained on the basis of the lowest signal. The lowest signal corresponds to $2^6$ photons. 6 bits are required in order to represent this signal. The noise of the signal, also containing information to be processed, results from its square root. Consequently, 3 bits are required for the noise of the signal. In the case of a signal with 28 photons, 8 bits are required and 4 bits are required for the noise of this signal. This ratio continues in dependence on the square root function.

The resolution of the signal, therefore, is dependent on its amplitude. For the highest signal shown in FIG. 1 the signal-to-noise ratio amounts to 10 bits whereas the signal-to-noise ratio for the smallest signal amounts to 3 bits only, i.e. the negative noise effect is less for smaller signals.

FIG. 1 shows that an overall dynamic range of 17 bits is required so as to ensure an amplification of the smallest noise signal (8 photons) and the highest signal (approximately one million photons). The analog-to-digital converters available in practice, however, have difficulty in providing such a large overall dynamic range and a high speed at the same time. Customarily they are designed for no more than from 12 to 14 bits. According to the invention, therefore, recourse is taken to a read-out amplifier which has a plurality of gain factors and selects a suitable gain factor in dependence on the magnitude of the integrated amount of charge, the number of bits thus being reduced. According to the invention this is realized in that a root function is linearly approximated in steps. Each amplification stage with its own gain factor covers a local dynamic range which is smaller than the overall dynamic range of the analog-to-digital converter. This is symbolized by the subdivision into two blocks with a gain factor 1 and a gain factor 2 in FIG. 1. When the summed signal increases to a value higher than $2^{12}$ photons, i.e. 12 bits, switching over takes place to the gain factor V2 which reduces the required number of bits by way of a lower factor. For example, in the case of the highest signal of $10^6$ photons, this factor ensures that only 10 bits instead of 20 bits are required for the signal processing.

Figure 2:
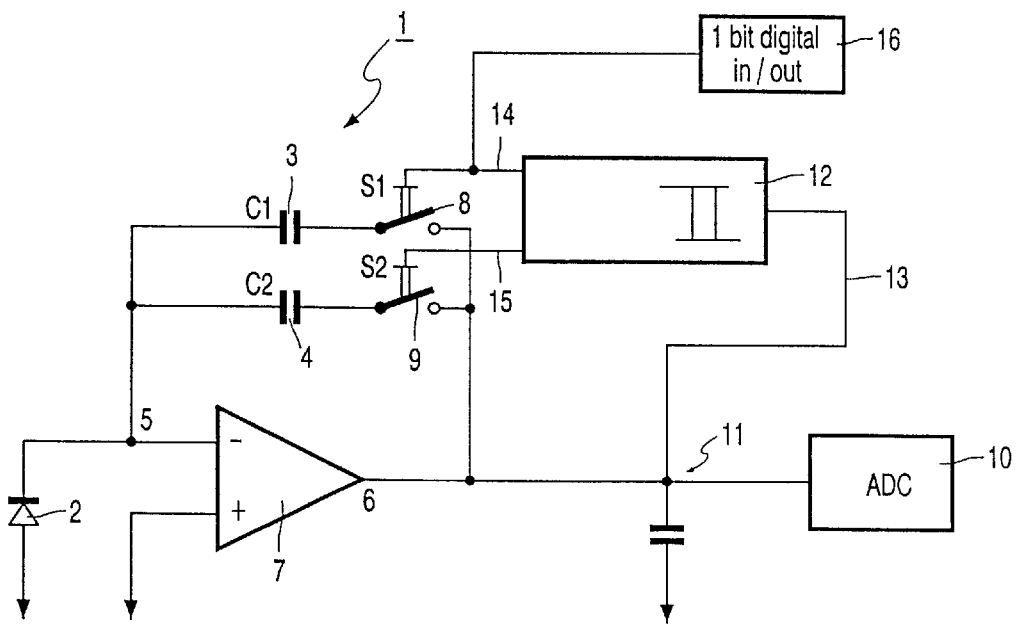
FIG. 2 shows a circuit diagram of a two-stage read-out amplifier with automatic gain factor control.

FIG. 2 shows a circuit diagram for a two-stage read-out amplifier for an X-ray detector. The read-out amplifier, denoted overall by the reference numeral 1, integrates the input signal from a sensor element 2, in this case being a photodiode, on feedback capacitance's 3 and 4. The input signal is proportional to the number of X-ray photons received from the respective photodiode. The feedback capacitance's are connected, via switches 8 and 9, parallel to an inverting input 5 and to an output 6 of an operational amplifier 7. The amplifier 1 is connected to an analog-to-digital converter 10 which converts the output signal of the amplifier into a digital signal.

Integration of the charge on the feedback capacitance 3, 4 produces an output voltage which is proportional to the number of X-ray photons during a frame or exposure. The output voltage is reciprocal to the magnitude of the feedback capacitance's. A linear approximation of the desired root function can be achieved by way of a suitable choice of the magnitude of the capacitance's for a given interval up to a given charge limit value. Each frame terminates with the transfer of the output voltage to a sample-and-hold stage 11. The output voltage of the sample-and-hold stage 11 after a frame is a direct measure of the number of X-ray photons.

In the present embodiment the integration of the charge commences with a high gain factor V1. To this end, the switch S1 or 8 is closed and the switch S2 or 9 is open. The input signal is integrated on the feedback capacitance 3. The output voltage increases. The capacitance of the capacitor is chosen to be such that the output voltage approximates the root function. The output signals thus amplified are stored in the sample-and-hold stage 11 and compared with a reference value by means of a comparator 12 and via a control line 13. When a predetermined maximum output voltage is reached, for example an output voltage corresponding to 12 bits in FIG. 1, the comparator 12 decides that a lower gain factor V2 is selected. To this end, the second feedback capacitor 4 is connected parallel to the first feedback capacitor with the control lead 14, via the control lead 15, in that the switch S2 or 9 is closed. The overall feedback capacitor then consists of the sum of the two capacitance's C1 and C2. Overall, the gain factor becomes lower. This linear reduction of the gain factor yields adaptation to the root function which increases less and less for larger bit numbers.

In addition to the analog output to the sample-and-hold stage 11, the read-out amplifier 1 has a digital output 16 which supplies the control information concerning the selected gain factor. In the embodiment involving two gain factors, one bit suffices for this purpose. This embodiment offers mixed analog/digital processing of the signals.

The second embodiment which is based on the switching over in dependence on a count will be described in detail hereinafter as a purely digital solution. The output voltage, being compared with a corresponding limit value, is then converted into a numerical value by way of the count method. According to a known method, integration on a feedback capacitor is performed for this purpose. When the output voltage reaches a maximum, predetermined value, the capacitor is reset. Each reset corresponds to a numerical value. The number of reset operations is summed. After the last frame, the number in the form of a digital signal corresponds to the number of reset operations having taken place and hence is a measure of the analog signal.

In order to achieve adaptation of the relevant numerical value by way of a corresponding gain factor, thus reducing the number of bits for the processing of the digital signal, a step-wise linear reduction of the numerical value is performed. In conformity with the example shown in FIG. 3 (Table 1), the integration commences with a gain factor 0 and a comparator oriented on the noise of the smallest signal. Due to the summing of the charges, and hence the sequence of reset operations, the numerical value increases until it reaches, for example, a factor which is four times greater than the minimum signal. This numerical value corresponds to a number of bits amounting to 5. This numerical value itself corresponds to a maximum signal of 8 bits, that is, $2^8$ photons. When 5 bits have been reached, the gain factor is reduced. This is achieved by means of the circuit elements which are known from FIG. 2, a first capacitance then being connected parallel to a second capacitance.

During a second step the numerical value increases, be it more slowly, because the gain factor is lower. The second step is terminated when a numerical value is reached which corresponds to 6 bits or a signal of 10 bits or $2^{10}$ photons. During a third step the gain factor is reduced by a corresponding factor again and the summing of the numerical value is continued until a value is reached which requires 7 binary numbers. This method of counting is repeated until the entire dynamic range has been scanned. It appears from FIG. 3 that in conformity with the proposed method the highest signal with approximately 1 million photons or $2^{20}$ bits corresponds to a numerical value of 11 bits.

FIG. 3 shows the described sequence of gain factors, the numerical values in bits as well as the maximum signals in bits which have been reduced by the linear amplification. Overall, a dynamic range of 17 bits is restricted to the processing of 12 bits.

A further version of the digital counting method can be combined again with analog signals. Suitable counting methods are feasible for adaptation of the counting method of FIG. 1.

What is claimed is:

1. A computed tomography apparatus which includes a radiation source, a detector device and an analog-to-digital converter for converting the detector output signals into digital values, characterized in that the apparatus includes a read-out amplifier (1) which precedes the analog-to-digital converter (10) and has a plurality of gain factors and a control system (12) for the respective, gain factor which, when a predetermined limit value of the integrated input signal is reached, automatically selects an appropriate, each time lower gain factor for the step-wise linear approximation of a proportional ratio between the digital values and the square root of the detector output signals.

2. A computed tomography apparatus as claimed in claim 1, characterized in that the gain factor is chosen to be such that the noise of the respective smallest signal is still detected in the relevant interval and that the number of bits of the respective largest signal does not exceed the number of bits that can still be processed by the analog-to-digital converter.

3. A computed tomography apparatus as claimed in claim 1, characterized in that the amplifier input signals are summed as analog signals and that the control system switches over to a respective lower degree of amplification when a predetermined maximum limit value of the output voltage is reached.

4. A computed tomography apparatus as claimed in claim 3, characterized in that a digital signal (16) provides the control information concerning the selected gain factor for the re-multiplication, during a post-processing step, of the signal reduced in the amplifier.

5. A computed tomography apparatus as claimed in claim 3, characterized in that the charge integrating read-out amplifier (1) includes an operational amplifier (7) with an inverting input (5), a non-inverting input and an output (6) as well as a plurality of capacitors (3, 4) which can be connected parallel to the operational amplifier between the inverting input (5) and the output (6) of the operational amplifier (7), by means of switching means (8, 9), that the control system (12) includes a comparator (12) for the comparison and control of the switching means (8, 9), the comparator (12) comparing the integrated input signal of the read-out amplifier (1) with the predetermined charge limit value and issues the command for the switching means (8, 9) to switch over to a lower gain factor when the charge limit value is exceeded, that the capacitance's of the parallel connected capacitors are chosen to be such that via the respective resultant overall gain factor the resultant linear amplification approximates the root function in the relevant integration interval, and that the respective gain factor chosen is stored as control information (16) for further processing.

6. A computed tomography apparatus as claimed in claim 1, characterized in that the instant of switching over of the switching means is restricted to a defined time window of the overall integration time.

7. A computed tomography apparatus as claimed in claim 1, characterized in that the amplifier input signals are summed as numerical values in that the charge integrating amplifier is reset to the zero position when a maximum limit value is reached for the output voltage and the number of reset operations yields the numerical value, and that a comparator switches over to a respective lower gain factor when a predetermined, each time maximum numerical value is reached.

8. A computed tomography apparatus as claimed in one of the claims 1, characterized in that the amplifier and the analog-to-digital converter are constructed completely by means of the CMOS technology.

* * * * *